(12) United States Patent
Sreenivasula Reddy et al.

(10) Patent No.: US 10,199,095 B1
(45) Date of Patent: Feb. 5, 2019

(54) BIT LINE STRAPPING SCHEME FOR HIGH DENSITY SRAM

(71) Applicant: GLOBALFOUNDRIES INC., Grand Cayman (KY)

(72) Inventors: Dhani Reddy Sreenivasula Reddy, Bengaluru (IN); Venkatraghavan Bringivijayaraghavan, Cheyyar (IN); Vinay Bhat Soori, Kumta (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/693,637

(22) Filed: Sep. 1, 2017

(51) Int. Cl.
*G11C 11/22* (2006.01)
*G11C 11/419* (2006.01)
*G11C 11/412* (2006.01)
*G11C 11/413* (2006.01)

(52) U.S. Cl.
CPC .......... *G11C 11/419* (2013.01); *G11C 11/412* (2013.01); *G11C 11/413* (2013.01)

(58) Field of Classification Search
CPC .... G11C 11/149; G11C 11/412; G11C 11/413
See application file for complete search history.

(56) References Cited

U.S. PATENT DOCUMENTS

| 5,831,315 | A | 11/1998 | Kengeri et al. |
| 6,072,732 | A * | 6/2000 | McClure .............. G11C 7/1006 365/149 |
| 6,266,264 | B1 | 7/2001 | Proebsting |
| 6,778,431 | B2 * | 8/2004 | Gogl .................. G11C 11/1673 365/171 |
| 6,826,083 | B2 | 11/2004 | Pascucci |
| 7,675,124 | B2 | 3/2010 | Liaw |
| 8,370,557 | B2 | 2/2013 | Dama et al. |
| 9,437,270 | B2 * | 9/2016 | Yi ....................... G11C 11/1653 |
| 9,916,889 | B1 * | 3/2018 | Duong .................. G11C 11/419 |

OTHER PUBLICATIONS

TW Office Action dated May 7, 2018 in related Application No. 106138448, 9 pages.
TW Notice of Allowance dated Sep. 14, 2018 in related Application No. 106138448, 4 pages.

\* cited by examiner

*Primary Examiner* — Pho M Luu
(74) *Attorney, Agent, or Firm* — Michael LeStrange; Andrew M. Calderon; Roberts Mlotkowski Safran Cole & Calderon, P.C.

(57) ABSTRACT

A structure includes a write bit switch device which includes a plurality of bit switch devices positioned at different positions of a memory cell array, and which is configured to enable write operations at a specified number of cells per bit line using a strapped bit line on a selected column of the memory cell array.

20 Claims, 5 Drawing Sheets

BIT LINE STRAPPING SCHEME FOR HIGH DENSITY SRAM

FIELD OF THE INVENTION

The present disclosure relates to a bit line strapping scheme, and more particularly, to a bit line strapping scheme for a high density static random access memory (SRAM) to improve array write and read cycle time.

BACKGROUND

Memory chips comprise an array of memory cells which are interconnected by bit lines and word lines. The word lines and bit lines are used to read and write binary values to each of the memory cells. Each of the memory cells represents a bit of information. Since each memory cell represents a bit of information and may be connected to other circuitry, it is desirable that the electrical and operational characteristics of all memory cells be consistent.

The operational and electrical characteristics of memory cells vary depending on where a memory cell is located within a layout of the memory array. For example, memory cells along an edge of the memory array may have different electrical and operational characteristics than memory cells located in the inner region of the memory array. Therefore, a memory array may not have consistent electrical and operational characteristics throughout the memory chip.

In high density technologies (e.g., 7 nanometer technology or lower), each metal layer of a static random access memory (SRAM) is very resistive. Further, in the SRAM, a bit line (BL) is routed to a M0 metal layer (i.e., the lowest metal layer in the SRAM) for read and write operations. Therefore, a RC time constant (i.e., a time constant of a RC circuit which is a product of the RC circuit resistance and the RC circuit capacitance) of the bit line (BL) restricts a maximum number of cells per bit line (CPBL) of a memory bank in the SRAM. Further, after several read and write operations are performed, the RC time constant can degrade read and write cycle times. In particular, write operations are usually more sensitive than read operations because a bit line has higher read current than write current and relaxing a write line setting (WL-SET) for the read current can improve read operations.

SUMMARY

In an aspect of the disclosure, a structure includes a write bit switch device which includes a plurality of bit switch devices positioned at different positions of a memory cell array, and which is configured to enable write operations at a specified number of cells per bit line using a strapped bit line on a selected column of the memory cell array In another aspect of the disclosure, a structure includes a write bit switch device which includes a first bit switch device and a second bit switch device positioned at different locations with respect to a memory cell array, the write bit switch device being configured to enable write operations at a specified number of cells per bit line using a shared strapped bit line between adjacent columns of the memory cell array in a static random access memory (SRAM).

In another aspect of the disclosure, a method includes setting up at least one write operation for a write bit switch device using a shared strapped bit line between adjacent columns of a memory cell array, and performing the at least one write operation at a specified number of cells per bit line at a selected column of the adjacent columns of the memory cell array using the shared strapped bit line after setting up of the at least one write operation for the write bit switch device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a bit line strapping scheme, and more particularly, to a bit line strapping scheme for a high density static random access memory (SRAM) to improve array write and read cycle time. In embodiments, a bit line strapping scheme will enable write operations to occur with a higher number of cells per bit line (CPBL). Further, the bit line strapping scheme improves memory density and can also improve voltage minimum (i.e., Vmin). For example, Vmin is improved by providing a lower voltage operation than a conventional SRAM. The bit line strapping scheme of the present disclosure will also enable faster array read and write cycle times. Further, the bit strapping scheme of the present disclosure will improve write operations without impacting readability and stability. Moreover, although the present disclosure relates to SRAM, one of ordinary skill in the art would understand that embodiments are not limited to such memory and can be applicable to other memory types (e.g., DRAM).

Figure 1:
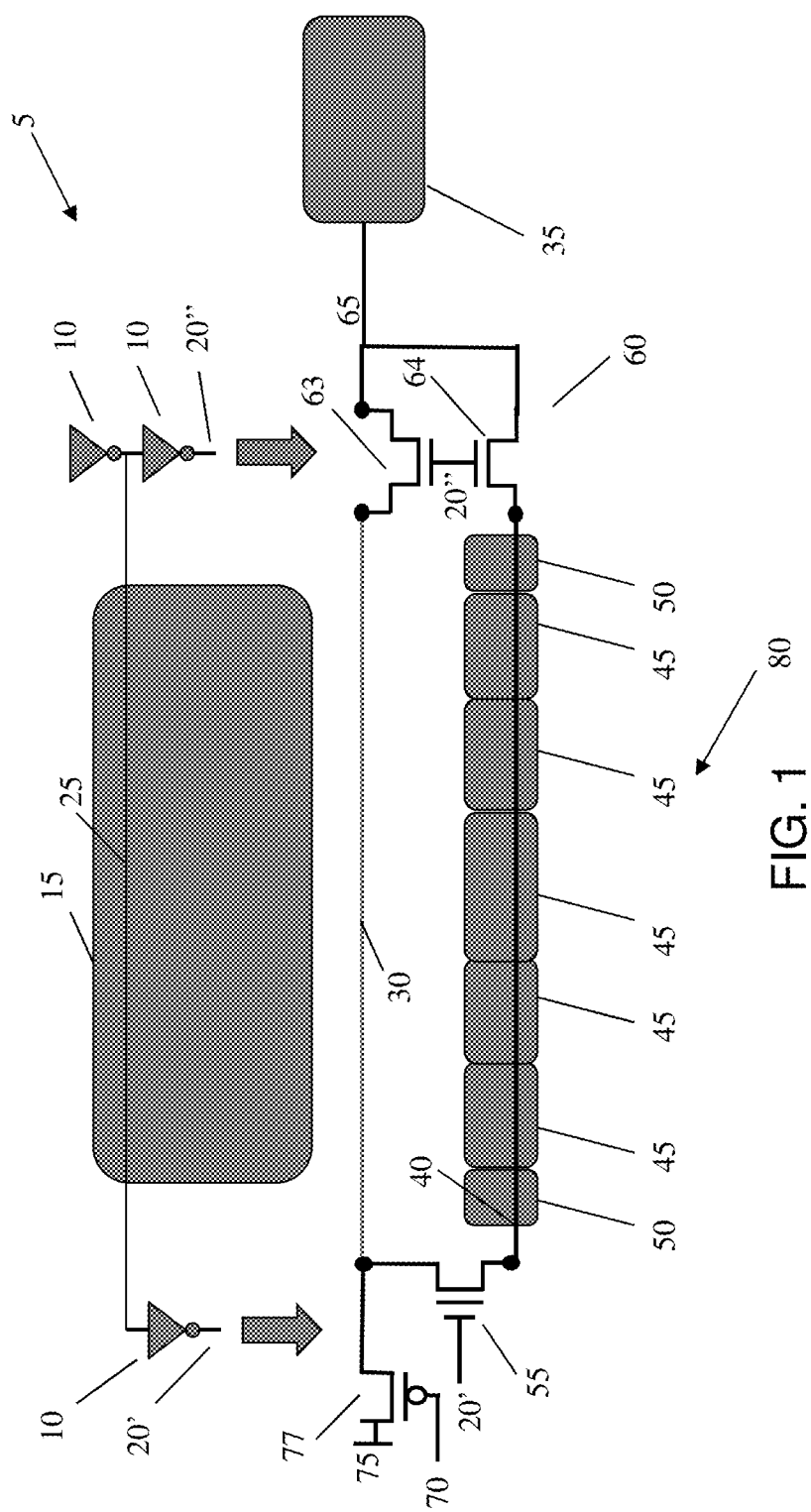
FIG. 1 shows a bit line strapping scheme with a write bit switch (WBS) structure in accordance with aspects of the present disclosure.

FIG. 1 shows a bit line strapping scheme with a write bit switch (WBS) structure in accordance with aspects of the present disclosure. Based on a typical write operation, the write bit switch (WBS) structure 5 in FIG. 1 improves a cell write time by 39% when compared to a non-strapped bit line. In particular, when using a strapped bit line, cell readability and stability is impacted due to an increased bit line cap. In contrast, the write bit switch (WBS) structure 5 in FIG. 1 improves write operations without impacting cell readability and stability.

In FIG. 1, a write bit switch (WBS) structure 5 includes inverters 10 arranged in parallel and which are connected through an inverted write bit switch signal 25. As shown in FIG. 1, the inverters 10 on the right side are also arranged in series. Further, a first write bit switch signal 20' and a second write bit switch signal 20" are connected to a corresponding inverter of the inverters 10. In FIG. 1, the inverted write bit switch signal 25 is routed over a word line driver 15.

In FIG. 1, a first write bit switch device 55 includes a NMOS transistor which includes a gate connected to the first write bit switch signal 20', a drain connected to a strapped bit line 30, and a source connected to a bit line 40 which is connected to an edge cell 50. A digit line true write line (DLTW)/a digit line complement write line (DLCW) signal 65 is connected to a write driver 35 and a second write bit switch device 60. The second write bit switch device 60 includes two NMOS transistors 63, 64 with a common gate. The common gate of the second write bit switch device 60 is connected to the second write bit switch signal 20". Further, one side (i.e., the left side of FIG. 1) of the second write bit switch device 60 is connected to a strapped bit line 30 and an edge cell 50; whereas the other side (i.e., the right side of FIG. 1) of the second write bit switch device 60 is connected to the DLTW/DLCW signal 65. The strapped bit line 30 is connected between the drain of the NMOS transistor in the first write bit switch device 55 and one of the two NMOS transistors 63 in the second write bit switch device 60.

In FIG. 1, the bit line 40 is routed over memory cells 45 and edge cells 50 and connects the first write bit switch device 55 with the second write bit switch device 60. The memory cells 45 and edge cells 50 are part of a memory cell array 80. In addition, the bit line 40 is routed through a M0 metal layer (i.e., the lowest metal layer in the SRAM). In contrast, the strapped bit line 30 is routed through a M2 metal layer (i.e., two levels above the M0 metal layer in the SRAM). Further, a BLRN signal 70 is a selection signal which either connects the strapped bit line 30 to a power supply VCS 75 or floats the strapped bit line 30 through a PMOS transistor 77.

In FIG. 1, the memory cell array 80 is connected to the first write bit switch device 55 and the second write bit switch device 60 through the bit line 40. Each of the two write bit switch devices 55, 60 are at different parallel locations of the memory cell array 80. In embodiments, for example, one of the two write bit switch devices 55 is located at a near side of the memory cell array 80; whereas the other of the two write bit switch devices 60 is located at a far side of the memory cell array 80. Accordingly, in one example, one of two write bit switch devices 55 is at a bit slice of the memory cell array 80 and the other of the two write bit switch devices 60 is at an array edge of the memory cell array 80. In particular, the memory cell array 80 is connected to the two write bit switch devices 55, 60 through the bit line 40.

The strapped bit line 30 can represent either a bit line true (BLT) signal or a bit line complement (BLC) signal through the M2 metal layer in a cell pitch. The bit line 40 can represent either a BLT signal or a BLC signal through the M0 metal layer in the cell pitch.

Still referring to FIG. 1, the write driver 35 can perform write operations for the memory cell array 80. Further, the inverted write bit switch signal 25 is routed over the word line driver 15 and is buffered at an array edge (e.g., edge cell 50). In particular, the inverted write bit switch signal 25 is inverted on both sides by the inverters 10 to create two write bit switch signals 20' and 20". Then, the two write bit switch signals 20', 20" are applied to each of the two write bit switch devices 55, 60 to turn each of the two write bit switch devices 55, 60 to the on state.

In FIG. 1, before a write operation is performed, data of the DLTW/DLCW signals 65 will be setup prior to an arrival of a write bit switch clock signal. Further, before a write operation is performed, the strapped bit line 30 is precharged to a specified voltage value based on the power supply VCS 75. Further, the strapped bit line 30 is strapped only during write operations for a selected column (i.e., strapped bit line 30 is not strapped during read operations).

Still referring to FIG. 1, before a write operation, the data of the DLTW/DLCW signals 65 will be setup during a write data setup time. Further, the strapped bit line 30 is precharged to the specified voltage value. Then, after the DLTW/DLCW signals 65 are setup, a write bit switch clock arrives and a write operation is performed by the write driver 35. During the write operation, an inverted write bit switch signal 25 is routed over the word line driver 15 and buffered through inverters 10. As a result of the inverted write bit switch signal 25 being inverted through inverters 10, the write bit switch signal 20' or 20" can be passed to the two write bit switch devices 55, 60 at the bit slice and the array edge of the memory cell array 80 to turn on the two write bit switch devices 55, 60. The write operation is completed in a selected column of the memory cell array 80 after the DLTW/DLCW signals 65 are routed through the strapped bit line 30 for a selected column and the bit line 40 to the memory cells 45 and edge cells 50 of the memory cell array 80.

In FIG. 1, during a read operation, the strapped bit line 30 will be a floating signal. Hence, the two write bit switch devices 55, 60 will not have an electrical path through the strapped bit line 30. Thus, the only path between the two write bit switch devices 55, 60 will be through the bit line 40. Further, when the strapped bit line 30 is precharged to a specified voltage value based on the power supply VCS 75, the two write bit switch devices 55, 60 will also not have an electrical path through the strapped bit line 30.

In embodiments, a SRAM array can include a configurable bit-line structure to separately optimize write and read characteristics. In an example, a lower resistance, higher capacitance bit line configuration can be used for write operations by selecting the strapped bit line 30 (i.e., in the M2 layer). Further, in another example, a higher resistance, lower capacitance bit line configuration can be used for read operations by selecting the bit line 40 (i.e., in the M0 layer) to enable fast sensing. Therefore, the strapped bit line 30 and the bit line 40 can be dynamically configured on a per cycle basis based on a read or write operation.

Figure 2:
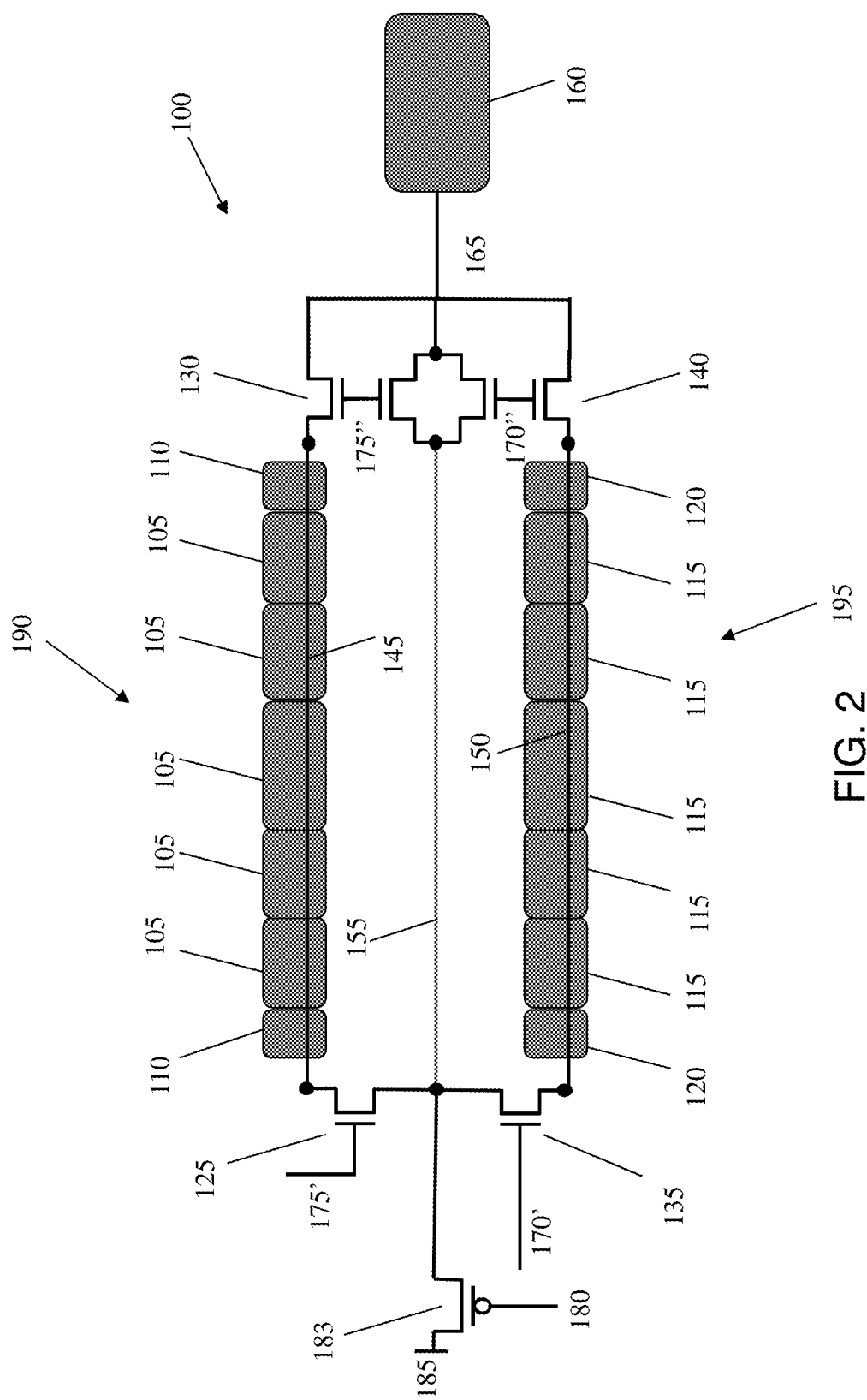
FIG. 2 shows a shared bit line strapping scheme with a write bit switch (WBS) structure in accordance with aspects of the present disclosure.

FIG. 2 shows a shared bit line strapping scheme with a write bit switch (WBS) structure in accordance with aspects of the present disclosure. In FIG. 2, a write bit switch (WBS) structure 100 includes parallel inverters 10 (similar to FIG. 1) connected through an inverted write bit switch signal 25 (similar to FIG. 1). Further, a first write bit switch signal 175' and a second write bit switch signal 175" are connected to a corresponding inverter of the parallel inverters 10 (similar to FIG. 1). In FIG. 2, the inverted write bit switch signal 25 is routed over a word line driver 15 (similar to FIG. 1). A third write bit switch signal 170' and a fourth write bit switch signal 170" are generated in a same way as the first write bit switch signal 175' and the second write bit switch signal 175".

In FIG. 2, a first write bit switch device 125 includes a NMOS transistor which includes a gate connected to the first write bit switch signal 175', a drain connected to a first bit line 145, and a source connected to a shared strapped bit line 155. Further, a second write bit switch device 130 includes two NMOS transistors with a common gate. The common gate of the second write bit switch device 130 is connected to the second write bit switch signal 175". Further, one side (i.e., the left side of FIG. 2) of the second write bit switch device 130 is connected to the first bit line 145 and the shared strapped bit line 155. The other side (i.e., the right side of FIG. 2) of the second write bit switch device 130 is connected to a digit line true write line (DLTW)/a digit line complement write line (DLCW) signal 165. The DLTW/

DLCW signal 165 is also connected to a write driver 160. The shared strapped bit line 155 is connected between a first node between the first write bit switch device 125 and a third write bit switch device 135 and a second node between the second write bit switch device 130 and a fourth write bit switch device 140.

In FIG. 2, the third write bit switch device 135 includes a NMOS transistor which includes a gate connected to the third write bit switch signal 170', a drain connected to the shared strapped bit line 155, and a source connected to a second bit line 150. Further, a fourth write bit switch device 140 includes two NMOS transistors with a common gate. The common gate of the second write bit switch device 130 is connected to the fourth write bit switch signal 170". Further, one side (i.e., the left side) of the fourth write bit switch device 140 is connected to the second bit line 150 and the shared strapped bit line 155. The other side (i.e., the right side) of the fourth write bit switch device 140 is connected to the DLTW/DLCW signal 165.

In FIG. 2, the first bit line 145 is routed over memory cells 105 and edge cells 110 and connects the first write bit switch device 125 with the second write bit switch device 130. The memory cells 105 and edge cells 110 are part of a first memory cell array 190 of a first column. In addition, the first bit line 145 is routed through a M0 metal layer (i.e., the lowest metal layer in the SRAM). The second bit line 150 is routed over memory cells 115 and edge cells 120. The memory cells 115 and edge cells 120 are part of a second memory cell array 195 of a second column. Further, the second bit line 150 is routed through a M0 metal layer (i.e., the lowest metal layer in the SRAM). In contrast, the shared strapped bit line 155 is routed through a M2 metal layer (i.e., two levels above the M0 metal layer in the SRAM). A BLRN signal 180 is a selection signal which either connects the shared strapped bit line 155 to a power supply VCS 185 or floats the shared strapped bit line 155 through a PMOS transistor 183.

Still referring to FIG. 2, the first memory cell array 190 is connected to the first write bit switch device 125 and the second write bit switch device 130 through the first bit line 145 of a first column. Each of the two write bit switch devices 125, 130 are at different parallel locations of the first memory cell array 190. In embodiments, for example, one of the first write bit switch devices 125 is located at a near side of the first memory cell array 190; whereas the other of the two write bit switch devices 130 is located at a far side of the first memory cell array 190. Accordingly, in one example, one of the two write bit switch devices 125 is at a bit slice of the first memory cell array 190 and the other of the two write bit switch devices 130 is at an array edge of the first memory cell array 190. In particular, the first memory cell array 190 is connected to the two write bit switch devices 125, 130 through the first bit line 145.

The shared strapped bit line 155 can represent either a bit line true (BLT) signal or a bit line complement (BLC) signal through the M2 metal layer in a cell pitch. The first bit line 145 can represent either a BLT signal or a BLC signal through the M0 metal layer in the cell pitch.

In FIG. 2, the second memory cell array 195 is connected to the third write bit switch device 135 and the fourth write bit switch device 140 through the second bit line 150 of a second column. Each of the two write bit switch devices 135, 140 are at different parallel locations of the second memory cell array 195. In embodiments, for example, one of the first write bit switch devices 135 is located at a near side of the second memory cell array 195; whereas the other of the two write bit switch devices 140 is located at a far side of the second memory cell array 195. Accordingly, in one example, one of the two write bit switch devices 135 is at a bit slice of the second memory cell array 195 and the other of the two write bit switch devices 140 is at an array edge of the second memory cell array 195. In particular, the second memory cell array 195 is connected to the two write bit switches 135, 140 through the second bit line 150.

The shared strapped bit line 155 can represent either a bit line true (BLT) signal or a bit line complement (BLC) signal through the M2 metal layer in a cell pitch. The second bit line 150 can represent either a BLT signal or a BLC signal through the M0 metal layer in the cell pitch.

The write driver 160 can perform write operations for one of the memory cell arrays 190, 195. In particular, based on a write bit switch (WBS) signal, a column (i.e., a first column corresponding to the first memory cell array 190 or a second column corresponding to the second memory cell array 195) is selected such that the shared strapped bit line 155 straps either the first bit line 145 (which corresponds with the first memory cell array 190) or the second bit line 150 (which corresponds with the second memory cell array 195). Moreover, similar to FIG. 1, the inverted write bit switch signal 25 is routed over the word line driver 15 and is buffered at an array edge (e.g., edge cell 110 or edge cell 120). Further, similar to FIG. 1, the inverted write bit switch signal 25 is inverted on both sides by the inverters 10 to create two write bit switches signals 175', 175" (i.e., first write bit switch signal 175', second write bit switch signal 175") or two write bit switch signals 170', 170" (i.e., third write bit switch signal 170', fourth write bit switch signal 170"). Thus, based on the WBS signal, either the two write switch signals 175', 175" are applied to each of the two write bit switch devices 125, 130 to turn each of the two write bit switch devices 125, 130 to the on state for a first column or the two write switch signals 170', 170" are applied to each of the two write bit switch devices 135, 140 to turn each of the two write bit switch devices 135, 140 to the on state for a second column.

In FIG. 2, before a write operation is performed, data of the DLTW/DLCW signals 165 will be setup prior to an arrival of a write bit switch clock signal. Further, before a write operation is performed, the shared strapped bit line 155 is precharged to a specified voltage value based on the power supply VCS 185. Further, the shared strapped bit line 155 is strapped only during write operations for a selected column (i.e., a first column corresponding to the first memory cell array 190 or a second column corresponding to the second memory cell array 195). In embodiments, the first column and the second column can be adjacent columns. The shared strapped bit line 155 is not strapped during read operations.

Still referring to FIG. 2, before a write operation, the data of the DLTW/DLCW signals 165 will be setup during a write data setup time. Further, the shared strapped bit line 155 is precharged to the specified voltage value. Then, after the DLTW/DLCW signals 165 are setup, a write bit switch clock arrives and a write operation is performed by the write driver 160. During the write operation, an inverted bit switch signal 25 is routed over the word line driver 15 and buffered through inverters 10 (similar to FIG. 1). As a result of the write bit switch signal 25 being inverted through inverters 10, the write bit switch signals 175', 175" or 170', 170" can be passed to their corresponding two write bit switch devices 125, 130 or 135, 140 at the bit slice and the array edge of the memory cell array 190 or memory cell array 195 to turn on their corresponding two write bit switch devices 125, 130 or 135, 140. Lastly, the write operation is completed in one of the first memory cell array 190 and the second memory cell array 195 after the DLTW/DLCW signals 165 are routed through the shared strapped bit line 155 for a selected column and one of the first bit line 145 to the memory cells 105 and edge cells 110 of the first memory cell array 190 and the second bit line 150 to the memory cells 115 and edge cells 120 of the second memory cell array 195.

Based on a typical write operation, the write bit switch structure 100 in FIG. 2, precharge power of the shared strapped bit line 155 will be reduced by half in comparison to a strapped bit line which is not shared. The precharge power of the shared strapped bit line 155 will be reduced by half because there is two columns which share a same strapped bit line 155 in a M2 metal layer of a cell pitch (i.e., instead of each column having a separate strapped bit line in a M2 metal layer of a cell pitch). Further, when using the write bit switch structure in FIG. 2, cell write time is improved by 39% when compared to a non-strapped bit line without impacting cell readability and stability.

In FIG. 2, during a read operation, the strapped bit line 155 will be a floating signal. Hence, none of the write bit switch devices 125, 130, 135, and 140 will have an electrical path through the strapped bit line 155. Thus, the only path between the two write bit switch devices 125, 130 will be through the first bit line 145. Further, the only path between the two write bit switch devices 135, 140 will be through the second bit line 150. When the shared strapped bit line 155 is precharged to a specified voltage value based on the power supply VCS 185, the write bit switch devices 125, 130, 135, and 140 will also not have an electrical path through the shared strapped bit line 155.

In embodiments, a SRAM array can include a configurable bit-line structure to separately optimize write and read characteristics. In an example, a lower resistance, higher capacitance bit line configuration can be used for write operations by selecting the shared strapped bit line 155 (i.e., in the M2 layer). Further, in another example, a higher resistance, lower capacitance bit line configuration can be used for read operations by selecting the first bit line 145 or the second bit line 150 (i.e., in the M0 layer) to enable fast sensing. Therefore, the shared strapped bit line 155, the first bit line 145, and the second bit line 155 can be dynamically configured on a per cycle basis based on a read or write operation.

Figure 3:
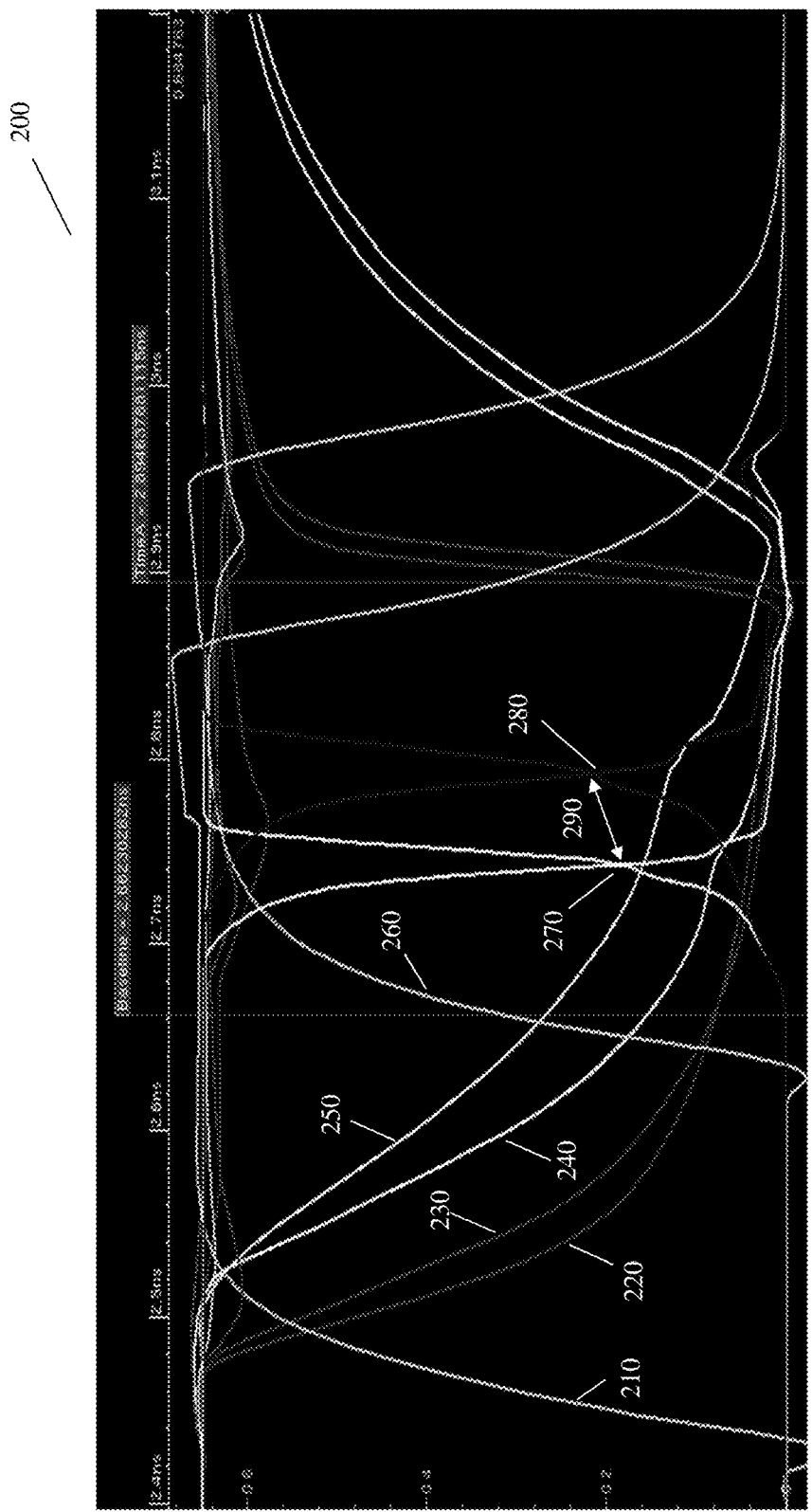
FIG. 3 shows a graph of the WBS structure in accordance with aspects of the present disclosure.

FIG. 3 shows a graph of the WBS structures in accordance with aspects of the present disclosure. In FIG. 3, the graph 200 of the WBS structures 5 and 100 shows the x-axis in nanoseconds from about 2.4 nanoseconds to about 3.4 nanoseconds. Further, the y-axis is in volts from about 0 volts to about 0.6 volts. The graph 200 includes write waveforms of a known non-strapped write bit switch and write waveforms of strapped write bit switches in FIGS. 1 and 2.

In particular, the graph 200 includes a near bit line complement (NBLC) of the known non-strapped write bit switch 220, a near bit line complement (NBLC) of the strapped write bit switches 230, a far bit line complement (FBLC) of the strapped write bit switches 240, and a far bit line complement (FBLC) of the known non-strapped write bit switch 250. A write bit switch signal 210, a word line 260, a data line of the strapped write bit switch 270, and a data line of the known non-strapped write bit switch 280 are also shown.

In embodiments, the near bit line complement (NBLC) of the known non-strapped write bit switch 220 and the strapped write bit switches 230 are complement bit line signals which are near the write bit switch device. Further, the far bit line complement (FBLC) of the strapped write bit switch 240 and the known non-strapped write bit switch 250 are complement bit line signals, which are far away from the write bit switch device.

In FIG. 3, after a write operation is performed, the value of the data line of the strapped write bit switch 270 in a cell of a memory cell array (i.e., memory) changes a binary value (e.g., from a binary value of "0" to a binary value of "1"). Therefore, as shown in FIG. 3, the data line of the strapped write bit switch 270 as implemented in the WBS structures 5 and 100 change a data value in approximately 79 picoseconds after a write operation is started. In contrast, the data line of a known non-strapped write bit switch 280 of a conventional structure changes a data value in approximately 128 picoseconds. Therefore, the data line of the strapped write bit switch 270 changes the data value approximately 39% faster than the change of data in the data line of the known non-strapped write bit switch 280. As shown in FIG. 3, a difference between the data line of the strapped write bit switch 270 changing and the data line of the known non-strapped write bit switch 280 is illustrated by the difference 290.

Figure 4:
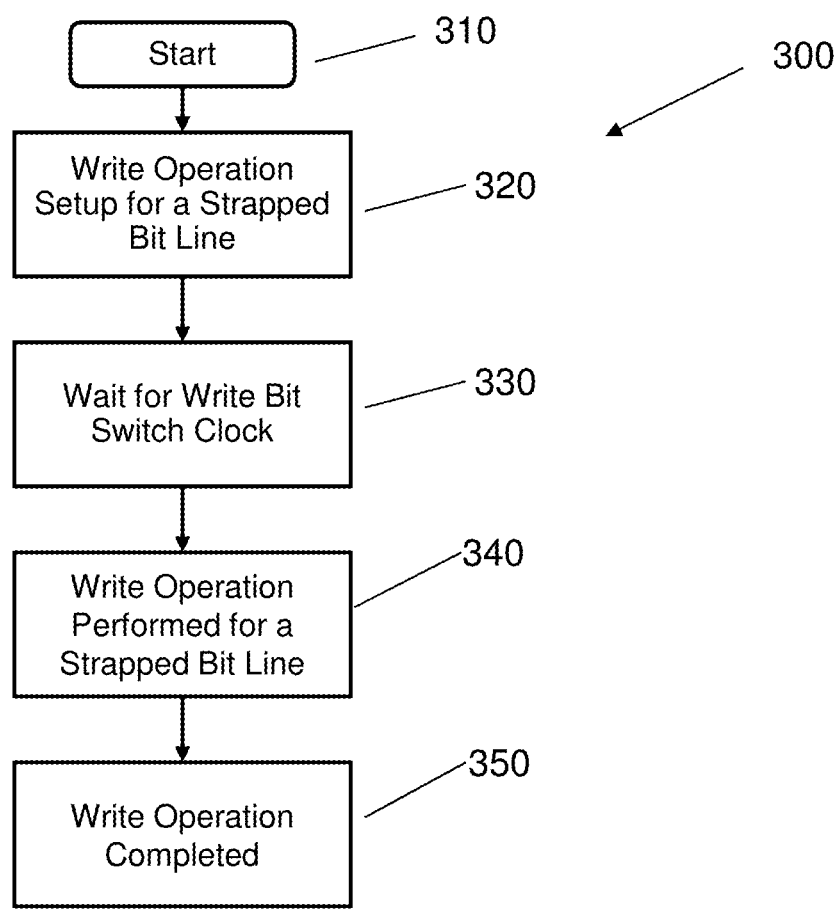
FIG. 4 shows a flowchart of a write operation using the bit line strapping scheme of the WBS structure in accordance with aspects of the present disclosure.

FIG. 4 shows a flowchart of a write operation using the WBS structure 5 in accordance with aspects of the present disclosure. The flow 300 for a write operation using the WBS structure 5 starts at step 310. At step 320, the DLTW/DLCW lines 65 will be setup for a write operation. In particular, the data of the DLTW/DLCW lines 65 will be setup during a write data setup time. Further, a strapped bit line 30 is precharged to a specified voltage value based on the power supply VCS 75. At step 330, the WBS structure 5 waits for a write bit switch clock to start a write operation.

At step 340, the write operation is performed using the write driver 35. During the write operation, the inverted write bit switch signal 25 is routed over the word line driver 15 and then buffered through inverters 10. As a result of the inverted write bit switch signal 25 being inverted through inverters 10, the write bit switch signals 20', 20" can be applied to the two write bit switch devices 55, 60 to turn on the two write bit switch devices 55, 60. In particular, the two write bit switch devices 55, 60 include a first bit switch device 55 at a bit slice of the memory cell array 80 and a second bit switch device 60 at an array edge of the memory cell array 80. Finally, at step 350, the write operation is completed in the memory cell array 80 after the DLTW/DLCW lines 65 are routed through the strapped bit line 30 over the memory cell array 80.

Figure 5:
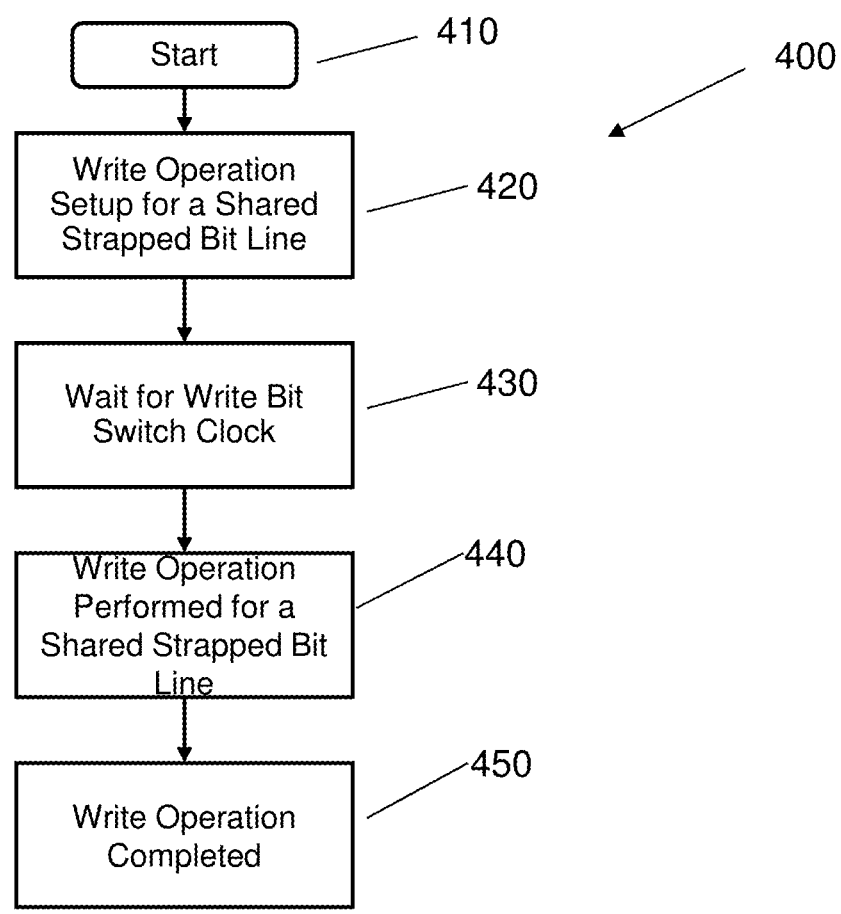
FIG. 5 shows a flowchart of a write operation using the shared bit line strapping scheme of the WBS structure in accordance with aspects of the present disclosure.

FIG. 5 shows a flowchart of a write operation using the WBS structure 100 in accordance with aspects of the present disclosure. The flow 400 for a write operation using the WBS structure 100 starts at step 410. At step 420, the DLTW/DLCW lines 165 will be setup for a write operation. In particular, the data of the DLTW/DLCW lines 165 will be setup during a write data setup time. Further, a shared strapped bit line 155 is precharged to a specified voltage value based on the power supply VCS 185. At step 430, the WBS structure 100 waits for a write bit switch clock to start a write operation.

At step 440, the write operation is performed using the write driver 160. During the write operation, the inverted write bit switch signal 25 is routed over the word line driver 15 and then buffered through inverters 10. As a result of the inverted write bit switch signal 25 being inverted through inverters 10, the write bit switch signals 175', 175" or 170', 170" can be applied to their corresponding two write bit switch devices 125, 130 or 135, 140 to turn on their corresponding two write bit switch devices 125, 130 or 135, 140. In particular, the two write bit switch devices 125, 130 include a first bit switch device 125 at a bit slice of the first memory cell array 190 and a second bit switch device 130 at an array edge of the first memory cell array 190. Moreover, the two write bit switch devices 135, 140 include a third bit switch device 135 at a bit slice of the second memory cell array 195 and a fourth bit switch device 140 at an array edge of the second memory cell array 195. Finally, at step 450, the write operation is completed in one of the first memory cell array 190 and the second memory cell array 195 after the DLTW/DLCW lines 165 are routed through the shared strapped bit line 155 for a selected column over one of the first memory cell array 190 (i.e., a first column) and the second memory cell array 195 (i.e., a second column).

The circuit and method for a write bit switch structure of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for a write bit switch structure of the present disclosure has been adopted from integrated circuit (IC) technology. For example, the structures are built on wafers and are realized in films of material patterned by photolithographic processes on the top of a wafer. In particular, the fabrication of the circuit and a method for a write bit switch structure uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a write bit switch device which comprises a plurality of bit switch devices positioned at different positions in a memory cell array, and which is configured to enable write operations at a specified number of cells per bit line using a strapped bit line on a selected column of the memory cell array.

2. The structure of claim 1, wherein the plurality of bit switch devices comprise:
    a first bit switch device which is positioned at a bit slice of the memory cell array; and
    a second bit switch device which is positioned at an array edge of the memory cell array.

3. The structure of claim 1, further comprising a write driver which is configured to perform the write operations using the strapped bit line on the selected column of the memory cell array, and the strapped bit line being a low resistance, high capacitance bit line configuration.

4. The structure of claim 1, further comprising a word line driver which is configured to drive a plurality of write bit switch lines for the write bit switch device.

5. The structure of claim 4, wherein the word line driver is further configured to drive the plurality of write bit switch lines for the write bit switch device using a plurality of inverters.

6. The structure of claim 1, wherein the write bit switch device is further configured to enable read operations using another non-strapped bit line for fast sensing, and the another non-strapped bit line being a high resistance, low capacitance bit line configuration.

7. The structure of claim 1, wherein the memory cell array is part of a static random access memory (SRAM).

8. A structure comprising a write bit switch device which includes a first bit switch device and a second bit switch device positioned at different locations in a memory cell array, the write bit switch device being configured to enable write operations at a specified number of cells per bit line using a shared strapped bit line between adjacent columns of the memory cell array in a static random access memory (SRAM).

9. The structure of claim 8, wherein the first bit switch device is positioned at a bit slice of the memory cell array and the second bit switch device is positioned at an array edge of the memory cell array.

10. The structure of claim 8, further comprising a write driver which is configured to perform write operations using the shared strapped bit line between adjacent columns at the memory cell array, and the shared strapped bit line being a low resistance, high capacitance bit line configuration.

11. The structure of claim 8, further comprising a word line driver which is configured to drive a plurality of write bit switch lines for the write bit switch device.

12. The structure of claim 11, wherein the word line driver is further configured to drive the plurality of write bit switch lines for the write bit switch device using a plurality of inverters.

13. The structure of claim 8, wherein the write bit switch device is further configured to enable read operations using another non-strapped bit line for fast sensing.

14. The structure of claim 13, wherein the another non-strapped bit line is a high resistance, low capacitance bit line configuration.

15. The structure of claim 8, wherein at least one write line is routed from the write bit switch device to the memory cell array.

16. A method, comprising:
    setting up at least one write operation for a write bit switch device in a memory cell array using a shared strapped bit line between adjacent columns of the memory cell array; and
    performing the at least one write operation at a specified number of cells per bit line at a selected column of the adjacent columns of the memory cell array using the shared strapped bit line after setting up of the at least one write operation for the write bit switch device.

17. The method of claim 16, further comprising receiving a write bit switch clock before performing the at least one write operation.

18. The method of claim 16, wherein the write bit switch device comprises a first bit switch device positioned at a bit slice of the memory cell array and a second bit switch device positioned at an array edge of the memory cell array to speed up the at least one write operation.

19. The method of claim 16, wherein the setting up the at least one write operation for the write bit switch device using the shared strapped bit line of the memory cell array comprises:

setting up a plurality of data lines during a write data setup time; and precharging the shared strapped bit line of the memory cell array to a specified voltage value based on a power supply voltage.

20. The method of claim 16, wherein the memory cell array is part of a static random access memory (SRAM).

* * * * *